United States Patent
Rachmady et al.

(10) Patent No.: US 8,377,771 B2
(45) Date of Patent: Feb. 19, 2013

(54) RECESSED WORKFUNCTION METAL IN CMOS TRANSISTOR GATES

(75) Inventors: Willy Rachmady, Beaverton, OR (US);
Brian McIntrye, Portland, OR (US);
Michael K. Harper, Hillsboro, OR (US); Subhash M. Joshi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/479,078

(22) Filed: May 23, 2012

(65) Prior Publication Data

US 2012/0264285 A1 Oct. 18, 2012

Related U.S. Application Data (62) Division of application No. 11/431,388, filed on May 9, 2006, now Pat. No. 8,193,641.

(51) Int. Cl.
*H01L 21/8238* (2006.01)

(52) U.S. Cl. .................... 438/216; 257/E21.202

(58) Field of Classification Search .............. 438/216
See application file for complete search history.

(56) References Cited

U.S. PATENT DOCUMENTS

| | | | |
|---|---|---|---|
| 6,653,698 B2 | 11/2003 | Lee et al. | |
| 6,730,581 B2 | 5/2004 | Suguro | |
| 6,784,472 B2 | 8/2004 | Iriyama et al. | |
| 7,153,784 B2 | 12/2006 | Brask et al. | |
| 7,390,709 B2 | 6/2008 | Doczy et al. | |
| 8,193,641 B2 * | 6/2012 | Rachmady et al. | 257/758 |
| 2001/0027005 A1 | 10/2001 | Moriwaki et al. | |
| 2003/0119292 A1 | 6/2003 | Lee et al. | |
| 2003/0216038 A1 | 11/2003 | Madhukar et al. | |
| 2004/0183143 A1 | 9/2004 | Matsuo | |
| 2005/0224886 A1 | 10/2005 | Doyle et al. | |

(Continued)

FOREIGN PATENT DOCUMENTS

| | | |
|---|---|---|
| WO | WO 01/97257 A2 | 12/2001 |
| WO | WO 2007/133440 A2 | 11/2007 |

(Continued)

OTHER PUBLICATIONS

PCT Search Report for PCT/US2007/010482 mailed Nov. 8, 2007, 9 pages.

(Continued)

*Primary Examiner* — David Vu
*Assistant Examiner* — Igwe U Anya
(74) *Attorney, Agent, or Firm* — Blakely, Sokoloff, Taylor & Zafman LLP (57) ABSTRACT

A transistor gate comprises a substrate having a pair of spacers disposed on a surface, a high-k dielectric conformally deposited on the substrate between the spacers, a recessed workfunction metal conformally deposited on the high-k dielectric and along a portion of the spacer sidewalls, a second workfunction metal conformally deposited on the recessed workfunction metal, and an electrode metal deposited on the second workfunction metal. The transistor gate may be formed by conformally depositing the high-k dielectric into a trench between the spacers on the substrate, conformally depositing a workfunction metal atop the high-k dielectric, depositing a sacrificial mask atop the workfunction metal, etching a portion of the sacrificial mask to expose a portion of the workfunction metal, and etching the exposed portion of the workfunction metal to form the recessed workfunction metal. The second workfunction metal and the electrode metal may be deposited atop the recessed workfunction metal.

24 Claims, 8 Drawing Sheets

U.S. PATENT DOCUMENTS

| | | | |
|---|---|---|---|
| 2005/0233527 A1 | 10/2005 | Brask et al. | |
| 2006/0008968 A1* | 1/2006 | Brask et al. | 438/206 |
| 2006/0065939 A1 | 3/2006 | Doczy et al. | |
| 2006/0121678 A1* | 6/2006 | Brask et al. | 438/287 |
| 2007/0037343 A1 | 2/2007 | Colombo et al. | |

FOREIGN PATENT DOCUMENTS

WO     WO 2007/133440 A3     1/2008

OTHER PUBLICATIONS

International Preliminary Report on Patentability received for International Application No. PCT/US2007/010482, mailed Nov. 20, 2008, 5 pages.

Office Action received United Kingdom Patent Application No. 0819771.7 mailed Feb. 8, 2011, 3 pages of Office Action.

Office Action received United Kingdom Patent Application No. 0819771.7 mailed Apr. 12, 2011, 2 pages of Office Action.

Office Action received Taiwanese Patent Application No. 96115613 mailed Aug. 24, 2010, 5 pages of Taiwanese Office Action and 5 pages of English Translation.

Office Action received for Chinese Patent Application No. 200780016613.2 mailed on May 11, 2010, 3 pages of Chinese Office Action and 2 pages of English Translation.

Examination Report received for United Kingdom Patent Application No. 0819771.7 mailed on Jun. 20, 2011, 1 page.

Office Action received for Korean Patent Application No. 10-2008-7027484 mailed Sep. 28, 2010, 8 pages of Korean Office Action and 7 pages of English Translation.

Office Action received for Korean Patent Application No. 10-2008-7027484 mailed Sep. 26, 2011, 2 pages of Korean Office Action and 1 page of English Translation.

Non Final Notice of Reasons for Rejection for Japanese Patent Application No. 2009-506646 mailed Mar. 2, 2012, 3 pages and English Translation of Notice of Reasons of Rejection.

\* cited by examiner

RECESSED WORKFUNCTION METAL IN CMOS TRANSISTOR GATES

This is a Divisional Application of Ser. No. 11/431,388 filed May 9, 2006, which is presently pending.

BACKGROUND

In the manufacture of next generation integrated circuits, the fabrication of gate electrodes for complementary metal-oxide-semiconductor (CMOS) transistors has advanced to replace silicon dioxide and polysilicon with high-k dielectric materials and metal. A replacement metal gate process is often used to form the gate electrode. A typical replacement metal gate process begins by forming a high-k dielectric material and a sacrificial gate between a pair of spacers on a semiconductor substrate. After further processing steps, such as an annealing process, the sacrificial gate is removed and the resulting trench is filled with one or more metal layers. The metal layers can include workfunction metals as well as electrode metal layers.

Processes such as atomic layer deposition (ALD), chemical vapor deposition (CVD), physical vapor deposition (PVD), electroplating (EP), and electroless plating (EL) may be used to deposit the one or more metal layers that form the metal gate electrode. Unfortunately, as CMOS transistor dimensions decrease, for instance, as transistor gate lengths reach 45 nm and below, issues such as trench overhang and void formation become more challenging and more rampant, especially when a dual-metal gate electrode is needed. This is because at smaller dimensions, the aspect ratio of the trench used to form the metal gate electrode becomes very aggressive as the dual-metal layers are deposited. As will be recognized by those of ordinary skill in the art, metallization of such a high aspect ratio trench quite often results in void formation.

Accordingly, an improved process of forming dual-metal gate electrodes for CMOS transistors at the 45 nm node level and beyond is needed.

DETAILED DESCRIPTION

Described herein are systems and methods of forming a dual-metal gate electrode. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention enable a void-free dual-metal gate electrode to be fabricated for a CMOS transistor, including transistors having a gate length of 45 nm or below. The dual-metal gate electrode is formed in a trench and includes multiple metal layers that include at least two workfunction metal layers and at least one electrode metal layer (also known as a fill metal layer). In accordance with an implementation of the invention, one of the workfunction metal layers consists of a recessed workfunction metal layer that enables the entrance to the trench to be wider, thereby causing the trench to have a less aggressive aspect ratio. A subsequent metallization of the trench can produce a void-free dual-metal gate electrode.

Figure 1A:
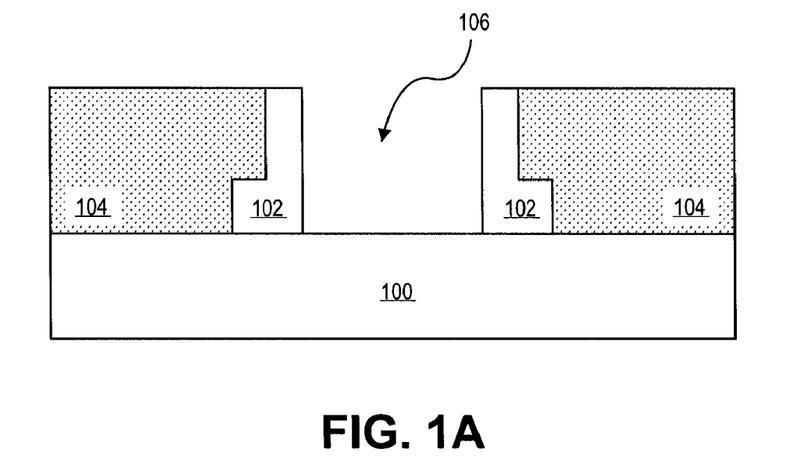
FIGS. 1A to 1D illustrate a conventional fabrication process for a dual-metal gate electrode.

For reference, FIGS. 1A to 1D illustrate a conventional process for forming a dual-metal gate electrode on a high-k dielectric material. FIG. 1A illustrates a substrate 100 upon which a dual-metal gate electrode may be formed. The substrate 100 may be a bulk silicon or a silicon-on-insulator substructure, among other materials. The substrate 100 includes spacers 102 and isolation structures 104 that are well known in the art. For instance, the spacers 102 may be formed using silicon nitride and the isolation structures 104 may be structures such as interlayer dielectrics (ILDs, as shown in FIG. 1), silicon dioxide layers, or shallow trench isolation (STI) structures. Between the spacers 102 is a trench region 106 in which a gate electrode may be formed.

Figure 1B:
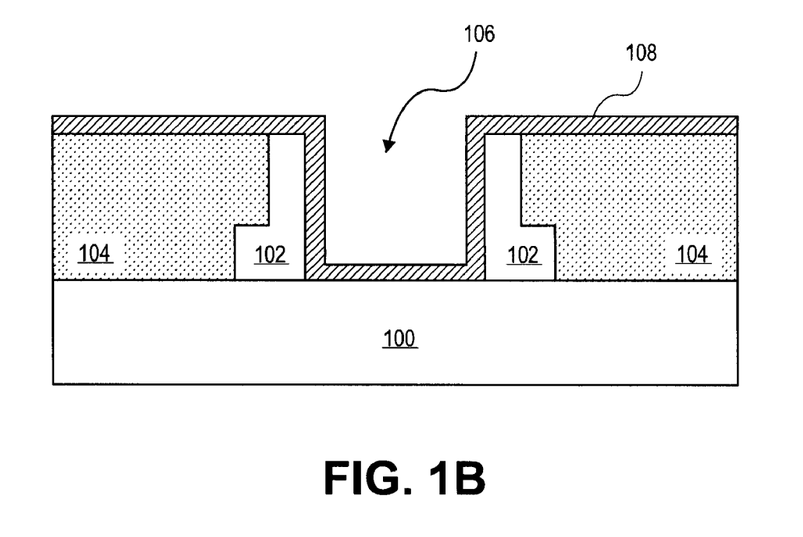

FIG. 1B illustrates the deposition of a high-k gate dielectric layer 108 atop the substrate 100 and within the trench 106. As shown, the high-k gate dielectric layer 108 conformally blankets the surfaces upon which it is deposited, including the bottom and sidewalls of the trench 106. One or more processes may follow the deposition of the high-k gate dielectric layer 108, such as the deposition of a sacrificial gate followed by an annealing process to enhance the quality of the high-k dielectric layer 108. If a sacrificial gate is used, it may subsequently be removed and replaced with one or more metal layers.

Figure 1C:
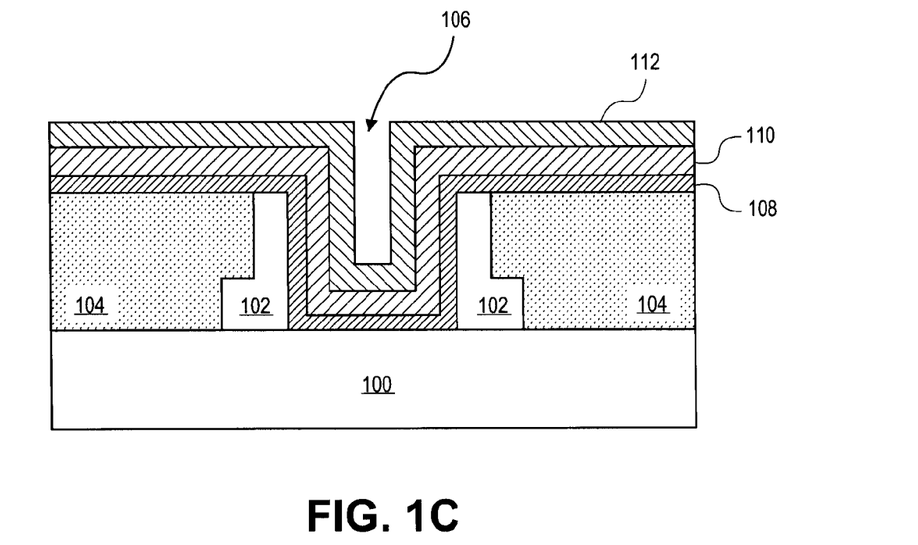

For example, following the removal of the optional sacrificial gate, FIG. 1C illustrates the deposition of one of more workfunction metal layers into the trench 106. Two workfunction metal layers are used here, a first workfunction metal layer 110 and a second workfunction metal layer 112. These two workfunction metals 110 and 112 form a dual-metal gate electrode. As shown, the aspect ratio of the trench 106 increases with each layer that is deposited. After the two workfunction layers 110 and 112 are deposited, the aspect ratio of the trench gap left to be filled is highly aggressive.

Figure 1D:
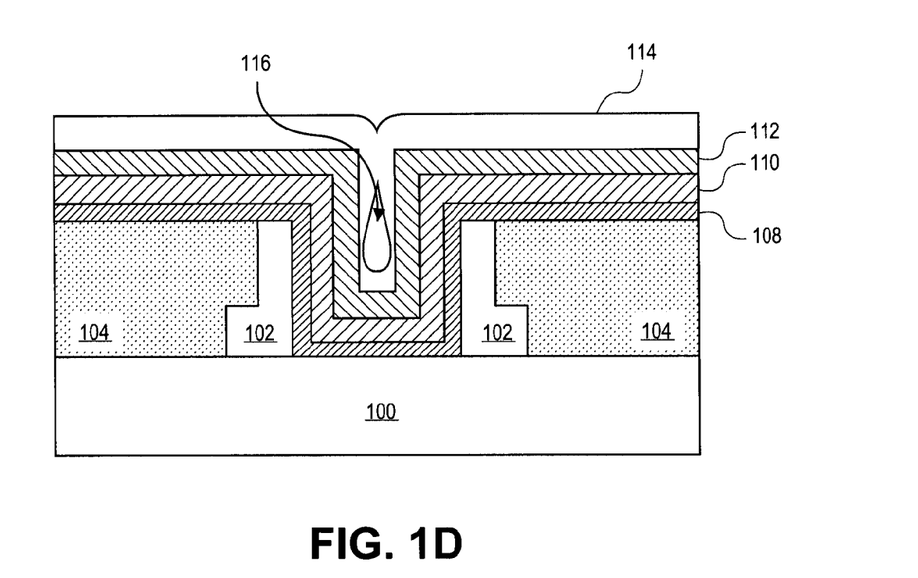

FIG. 1D illustrates the deposition of an electrode metal layer 114 into the trench 106. The electrode metal layer 114 serves to complete the formation of the dual-metal gate electrode. The electrode metal layer 114 is often formed using a fill metal that is more easily polished than metals conventionally used as workfunction metals. As shown in FIG. 1D, the high aspect ratio of the trench 106 causes trench overhang to occur during the deposition of the electrode metal layer 114, resulting in a void 116 being created within the trench 106. The presence of the void 116 increases the electrical resistance of the dual-metal gate electrode and decreases its reliability.

Figure 2:
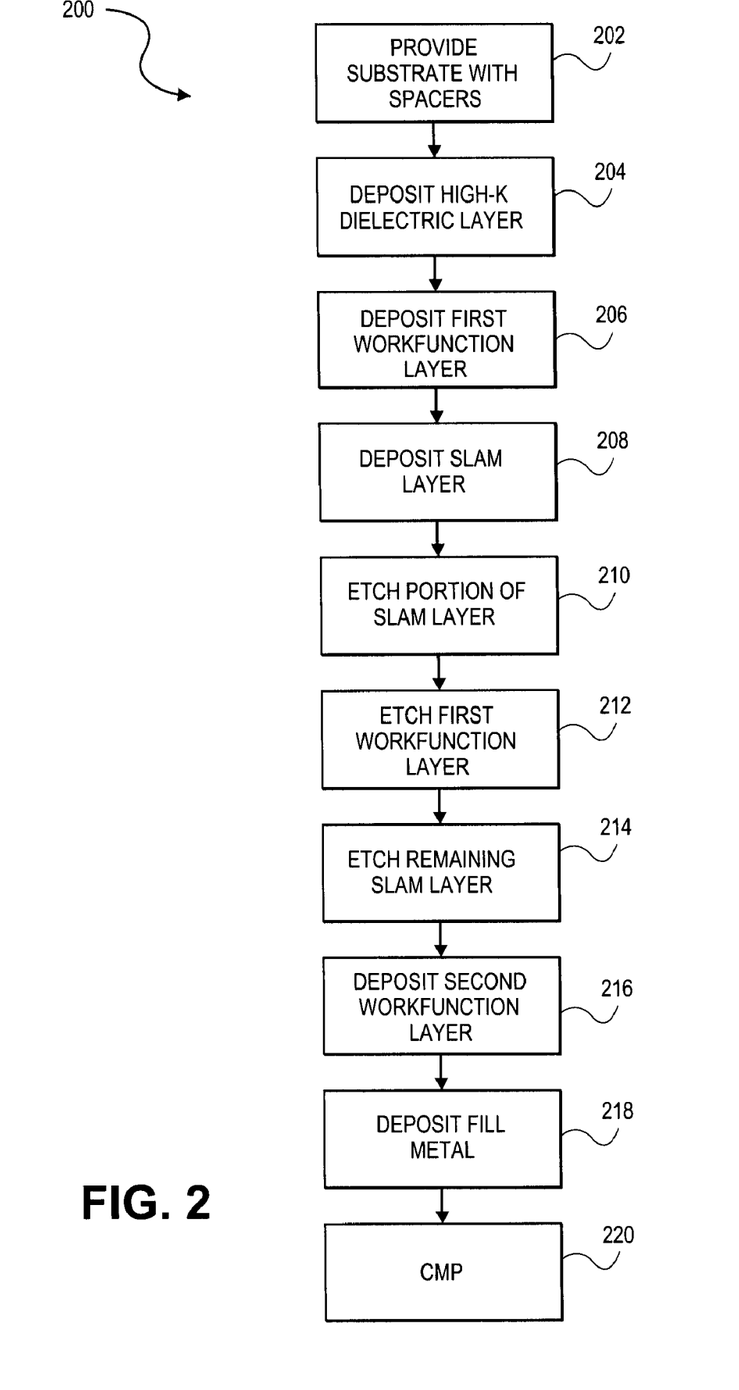
FIG. 2 is a method of fabricating a dual-metal gate electrode in accordance with an implementation of the invention.

To address this issue, the methods of the invention provide a fabrication process that enables void-free dual-metal gate electrodes to be formed. FIG. 2 is a method 200 of forming a dual-metal gate electrode in accordance with an implementation of the invention. FIGS. 3A to 3J Illustrate structures that are formed when the method 200 of FIG. 2 is carried out. For clarity, the structures of FIGS. 3A to 3J will be referenced during the discussion of method 200. It will be recognized by those of skill in the art that the method 200 may be integrated into a replacement metal gate process if desired.

Starting with method 200, a substrate is provided that includes at least a pair of spacers that are separated by a trench (process 202 of FIG. 2). As mentioned above, the substrate may consist of a structure commonly used in semiconductor processing, such as bulk silicon or a silicon-on-insulator structure. In other implementations, the substrate may be formed using alternate materials, which may or may not be combined with silicon, that include but are not limited to germanium, indium antimonide, lead telluride, indium arsenide, indium phosphide, gallium arsenide, or gallium antimonide. Although a few examples of materials from which the substrate may be formed are described here, any material that may serve as a foundation upon which a semiconductor device may be built falls within the spirit and scope of the present invention. The spacers may be formed from a material such as silicon nitride, silicon oxide, silicon carbide, or any of a variety of low-k nitrides or oxide materials.

Figure 3A:
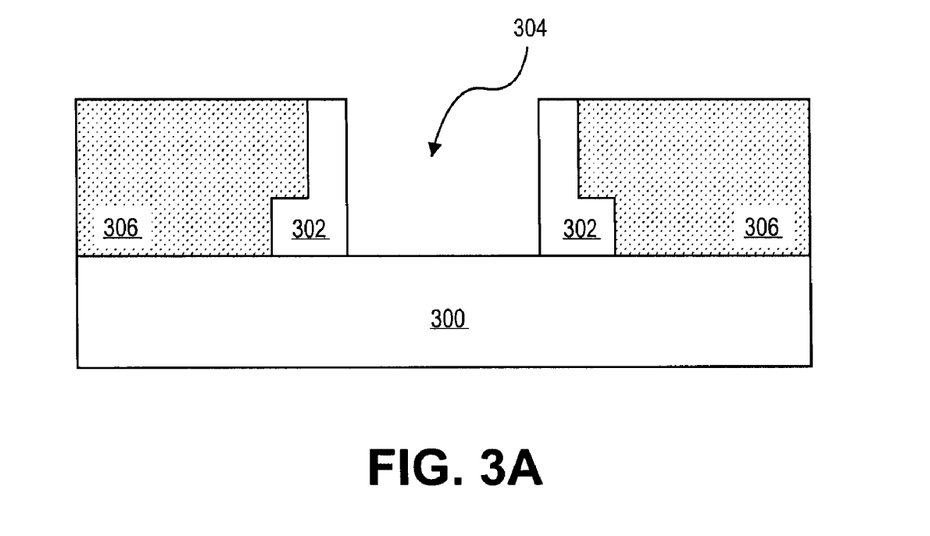
FIGS. 3A to 3J illustrate structures that are formed when carrying out the method of FIG. 2.

Turning to FIG. 3A, a substrate 300 is illustrated that includes a pair of spacers 302. The spacers are separated by a trench 304. The substrate 300 may also include other structures, such as an ILD layer 306 and STI structures (not shown).

Next, a high-k gate dielectric layer is deposited into the trench (process 204 of FIG. 2). A conformal deposition process may be used to deposit the high-k gate dielectric layer, such as a CVD or ALD process. Materials that may be used for the high-k gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Although a few examples of materials that may be used to form a high-k gate dielectric layer are described here, that layer may be made from other materials. In implementations where the method 200 is integrated into a replacement metal gate process, additional processing may be performed on the high-k dielectric layer, such as an annealing process to improve the quality of the high-k dielectric layer.

Figure 3B:
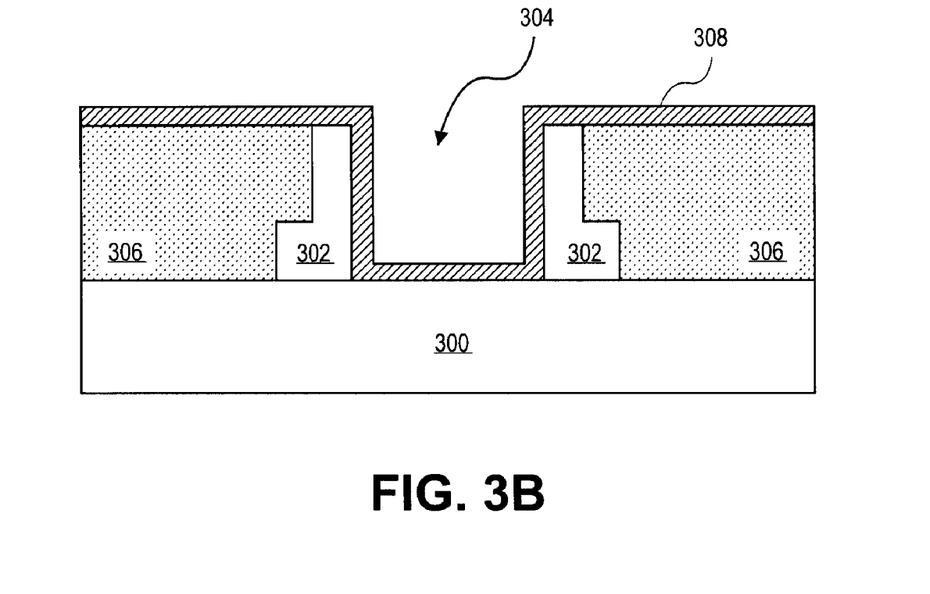

FIG. 3B illustrates a high-k gate dielectric layer 308 that has been conformally deposited within the trench 304. As shown, because the high-k gate dielectric layer 308 is conformally deposited, the layer 308 will form on the sidewalls of trench 304 as well as on the bottom of the trench 304. The high-k gate dielectric layer 308 will also form on the ILD layer 306. In some implementations, the high-k gate dielectric layer 308 may be less than about 60 Angstroms (Å) thick, and often between about 5 Å and about 40 Å thick. The thickness of the high-k dielectric layer 308 may vary depending on the requirements of the gate electrode being formed.

In an alternative process flow, the high-k gate dielectric layer may be formed by a subtractive process before the spacers are formed. For instance, a high-k dielectric layer may be formed on the substrate and etched back to form a planar high-k gate dielectric layer. Spacers may then be formed on opposing sides of the high-k gate dielectric layer.

In this alternate implementation, the high-k gate dielectric layer is present only on the bottom of the trench and not on the trench sidewalls.

After the high-k gate dielectric layer is deposited, a first workfunction metal layer may be deposited (process 206 of FIG. 2). Conventional deposition processes for workfunction metals may be used, such as CVD, ALD, PVD, sputtering, electroplating, or electroless plating. In some implementations of the invention, the thickness of the first workfunction metal layer may be between about 25 Å and about 200 Å.

Figure 3C:
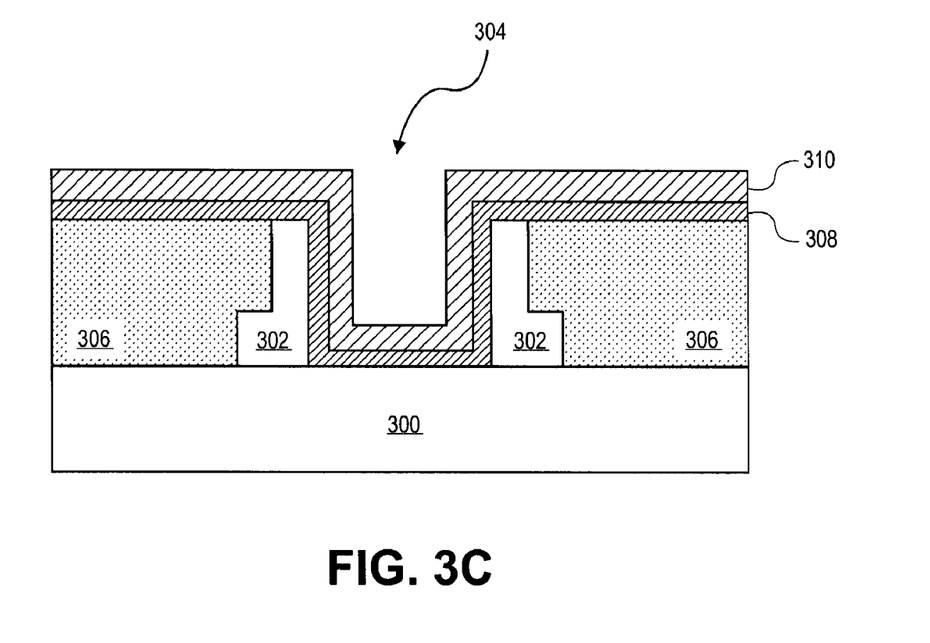

Turning to FIG. 3C, a first workfunction metal layer 310 is illustrated that has been deposited atop the high-k dielectric layer 308. The first workfunction metal layer 310 may consist of a p-type metal or an n-type metal, depending on whether the transistor is to be a PMOS or an NMOS transistor. In some implementations, a PMOS transistor is being formed and materials that may be used to form a p-type workfunction metal layer include, but are not limited to, ruthenium, palladium, platinum, cobalt, nickel, and conductive metal oxides, e.g., ruthenium oxide. A p-type metal layer will enable the formation of a PMOS gate electrode with a workfunction that is between about 4.9 eV and about 5.2 eV. Alternately, in some implementations an NMOS transistor is being formed and materials that may be used to form an n-type workfunction metal layer include, but are not limited to, hafnium, zirconium, titanium, tantalum, aluminum, and their alloys, e.g., metal carbides that include these elements, i.e., hafnium carbide, zirconium carbide, titanium carbide, tantalum carbide, and aluminum carbide. An n-type metal layer will enable the formation of an NMOS gate electrode with a workfunction that is between about 3.9 eV and about 4.2 eV.

Next, a sacrificial masking material is deposited into the trench atop the first workfunction metal (process 208 of FIG. 2). The sacrificial masking material will be used to define a recessed workfunction metal layer. In some implementations of the invention, the sacrificial masking material may be consist of a spin-on-glass (SOG) material, for instance, a sacrificial light absorbing material (SLAM). In another implementation, the sacrificial masking material may consist of a bottom anti-reflective coating material (BARC). SLAMs and BARCs are commonly used in semiconductor processing and provide the necessary functionality in this process. It should be noted that the light-absorbing properties of SLAMs and BARCs are not relevant for implementations of the invention. If a SOG material is used, a spin-on deposition (SOD) process may be used to deposit and planarize the SOG material atop the first workfunction metal layer. Two specific SOG materials that may be used are organic spin-on materials such as 193 nm SLAM and 248 nm SLAM.

Figure 3D:
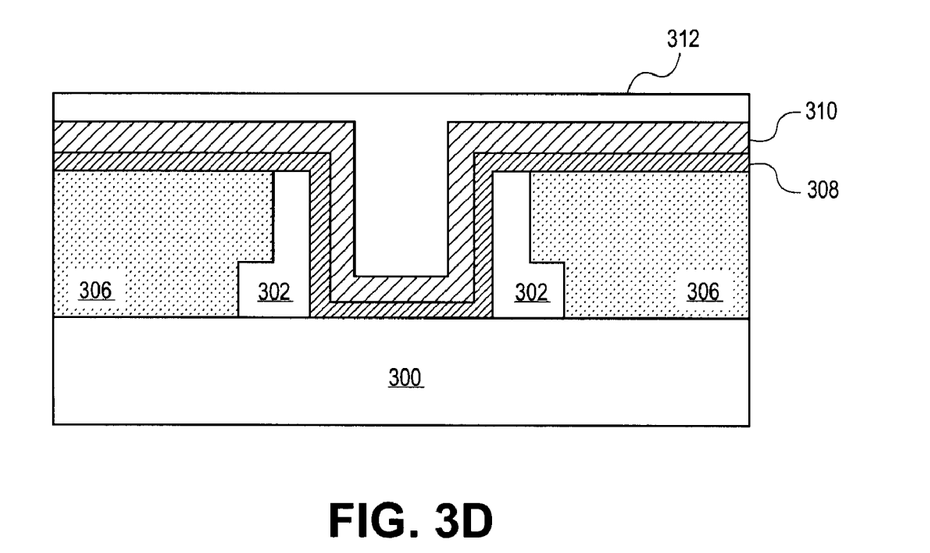

FIG. 3D illustrates the deposition of a sacrificial masking material 312 atop the first workfunction metal layer 310. The sacrificial masking material 312 fills the trench completely and may be deposited using an SOD process. As stated above, the use of an SOD deposition process may planarize the sacrificial masking material 312.

After the sacrificial mask deposition, an etching process may be carried out to partially etch back the sacrificial masking material (process 210 of FIG. 2). In various implementations of the invention, a wet etch chemistry or a dry etch chemistry may be used. The particular wet or dry etch chemistry used must be appropriate for the sacrificial masking material that is used. For example, if a SLAM material is used for the sacrificial masking material, then an appropriate wet etch chemistry may consist of a fluorine-based wet etch chemistry. In one implementation, such a fluorine-based wet etch may use a mixture of hydrogen fluoride (HF), ammonium fluoride ($NH_4F$), and distilled water to etch the SLAM layer. In another implementation, a hydroxyl-based wet etch chemistry may be used to etch the SLAM, for instance, a mixture of tetramethyl ammonium hydroxide (TMAH) and potassium hydroxide (KOH) in a polar solvent medium. Alternately, appropriate dry etch chemistries for a SLAM material may consist of a $CH_2F_2$ dry etch chemistry, a $SF_6$ dry etch chemistry, or a $NF_3$ dry etch chemistry.

Figure 3E:
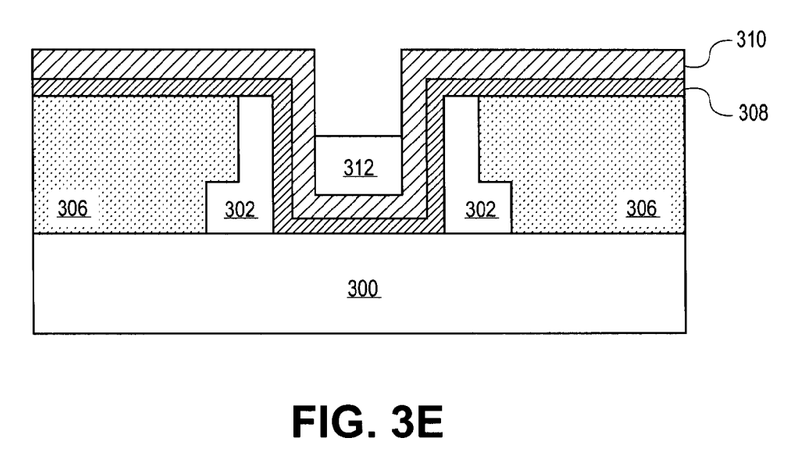

FIG. 3E illustrates the sacrificial masking material 312 after it has been etched down using the etch chemistry. In some implementations of the invention, the sacrificial masking material 312 is etched down until it is approximately one-half to three-quarters of the trench height. The etching process for the sacrificial masking material 312 generally has little impact on the first workfunction metal layer 310.

Figure 3F:
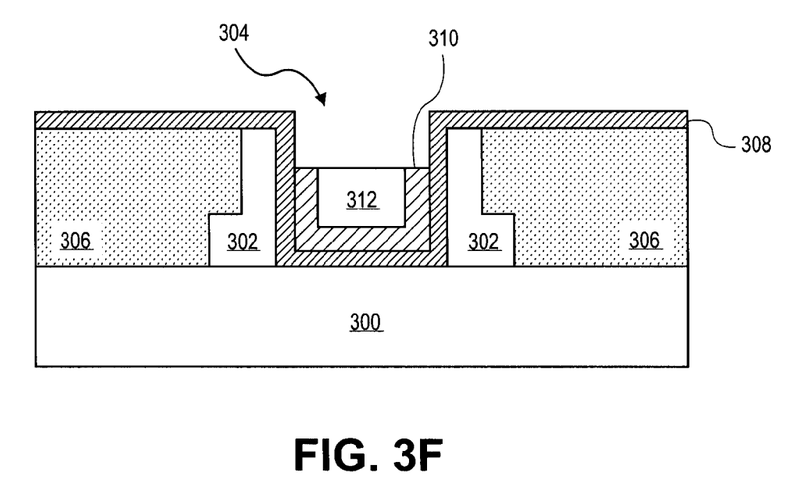

Next, another partial etching process is carried out, this time on the first workfunction metal layer (process 212 of FIG. 2). The partial etching of the first workfunction layer removes only the exposed portions of metal; portions of the first workfunction layer that are still covered by the sacrificial masking material are not etched. This partial etching results in the formation of a "U"-shaped recessed workfunction metal layer 310, as shown in FIG. 3F. In some implementations, a wet etch chemistry may be used to etch the first workfunction metal layer. For example, in one implementation, a combination of distilled water, ammonium hydroxide ($NH_4OH$), and hydrogen peroxide ($H_2O_2$), also known as a standard clean solution, may be used to etch the first workfunction metal layer. Another wet etch chemistry that may be used is a mixture of sulfuric acid and peroxide in distilled water. Additional wet etch chemistries that may be used in implementations of the invention include a mixture of phosphoric acid, acetic acid, and nitric acid, a mixture of hydrochloric acid, hydrogen peroxide, and water, and a mixture of hydrochloric acid, nitric acid, and water. In further implementations, dry etch chemistries may be used to partially etch the first workfunction metal layer.

As shown in FIG. 3F, the etching of the workfunction metal layer 310 causes the workfunction metal layer 310 to be recessed relative to the spacers 302 and therefore widens the opening of the trench 304, thereby decreasing its aspect ratio and allowing subsequently deposited metals to more easily enter the trench 304. This widening of the opening to the trench 304 substantially reduces or eliminates the occurrence of trench overhang. For instance, in implementations where the first workfunction metal layer 310 is around 25 Å thick, recessing the first workfunction metal layer 310 opens the trench 304 by approximately 50 Å.

Figure 3G:
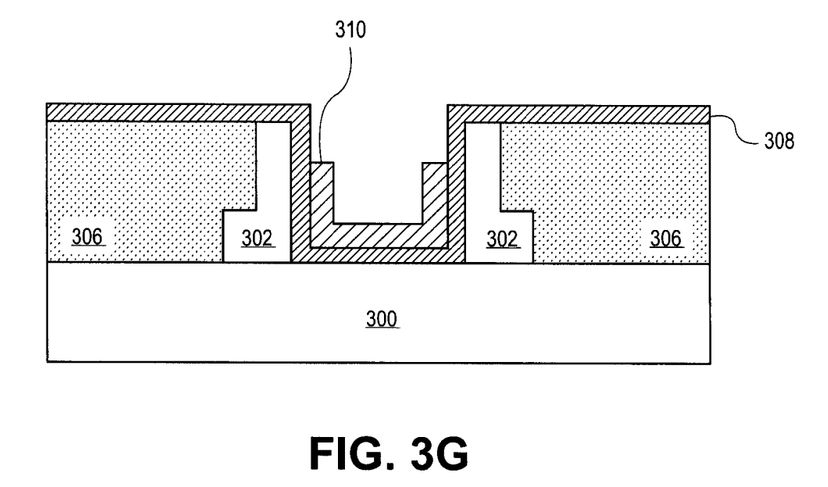

After the first workfunction metal layer 310 has been recessed, the remaining sacrificial masking material may be removed (process 214 of FIG. 2). In accordance with implementations of the invention, the same wet chemistry process that was used to partially etch the sacrificial masking material in process stage 210 may be used here to remove the remaining sacrificial masking material. In other implementations, alternate etching processes may be used. FIG. 3G illustrates the recessed workfunction metal layer 310 after the remaining sacrificial masking material 312 has been removed.

Next, a second workfunction metal layer is deposited to form the dual-metal gate electrode (process 216 of FIG. 2). Again, conventional deposition processes for workfunction metals may be used, such as CVD, ALD, PVD, sputtering, electroplating, or electroless plating. In some implementations of the invention, the thickness of the second workfunction metal layer may be between about 25 Å and about 200 Å.

The second workfunction metal may be a p-type metal or an n-type metal. In some implementations, both the first and second workfunction metals may be of the same type (i.e., two n-type metals or two p-type metals), while in other implementations, the first and second workfunction metals may be of different types (i.e., one n-type metal in combination with one p-type metal). P-type workfunction metals that may be used for the second workfunction metal layer include, but are not limited to, ruthenium, palladium, platinum, cobalt, nickel, and conductive metal oxides, e.g., ruthenium oxide. N-type workfunction metals that may be used for the second workfunction metal layer include, but are not limited to, hafnium, zirconium, titanium, tantalum, aluminum, and their alloys, e.g., metal carbides that include these elements, i.e., hafnium carbide, zirconium carbide, titanium carbide, tantalum carbide, and aluminum carbide.

Figure 3H:
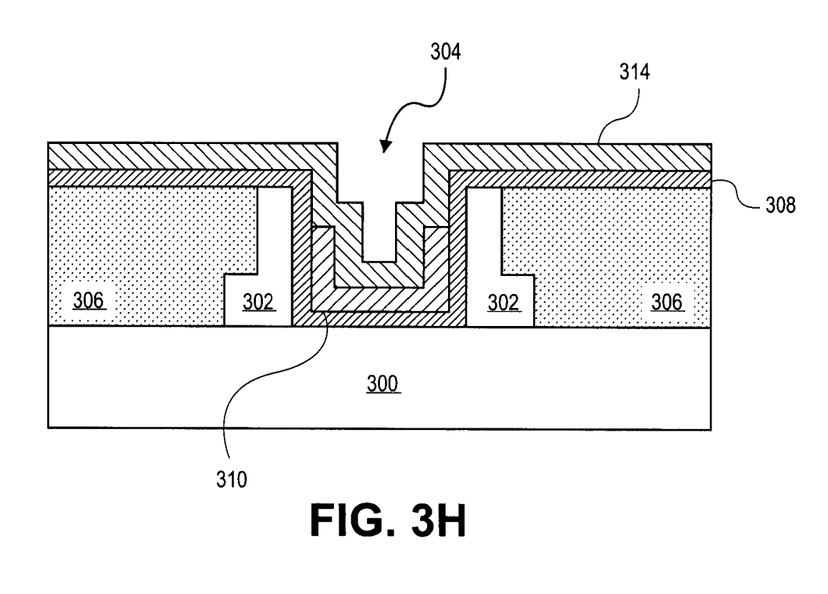

FIG. 3H illustrates a second workfunction metal layer 314 that has been conformally deposited atop the recessed workfunction metal 310. As shown, even though both the first and second workfunction metal layers 310/314 have been deposited, the trench 304 still has a wide opening that is advantageous for a subsequent metallization. The aspect ratio of the trench 304, even in its most narrow portion, is still much lower than the aspect ratio of a trench formed in conventional dual-metal gate processes.

Figure 3I:
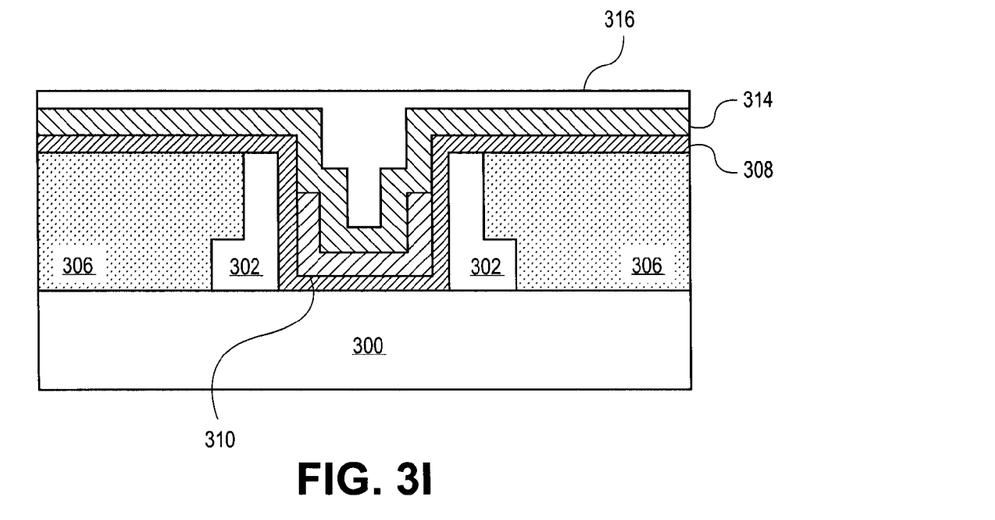

After the second workfunction metal layer is deposited, an electrode metal, also known as a fill metal, is deposited to completely fill the trench with metal (process 218 of FIG. 2). The fill metal is generally a material that may be easily polished, e.g., tungsten, aluminum, copper, or other low resistivity metals. FIG. 3I illustrates the deposition of a fill metal 316 that completely fills the trench 304 in a substantially void-free manner.

Figure 3J:
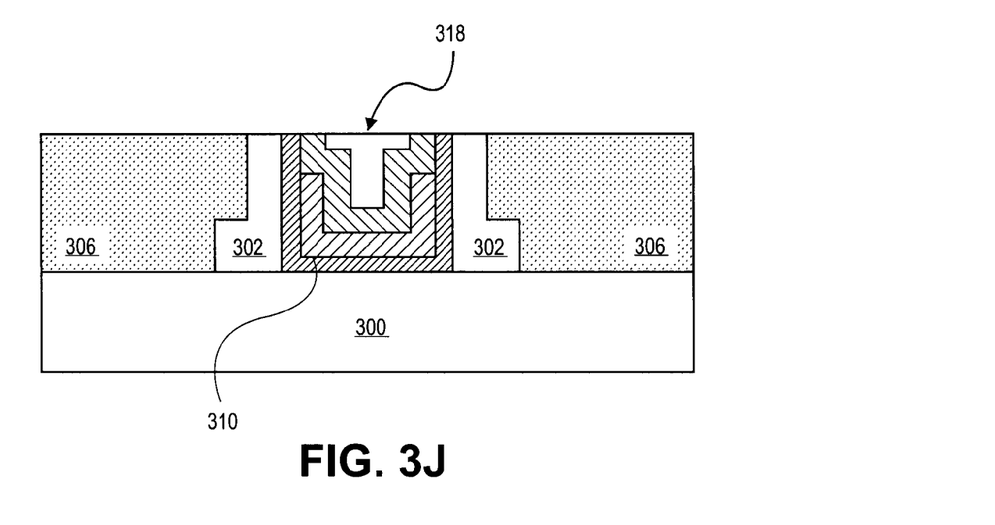

Finally, a chemical mechanical polishing (CMP) process may be implemented to remove excess layers of materials to complete the fabrication of the dual-metal gate electrode in accordance with the invention (process 220 of FIG. 2). FIG. 3J illustrates a final dual-metal gate electrode 318 after the CMP process has removed the excess material. For instance, the CMP process may remove not only the excess fill metal 316, it may also remove excess portions of the second workfunction metal layer 314 and the high-k dielectric layer 308.

In implementations of the invention, the dual-metal gate electrode 318 may be used to form CMOS transistors. For instance, a source region and a drain region may be formed within the substrate 300 adjacent to the spacers 302. The regions of the substrate 300 adjacent to the spacers 302 may be doped using an ion implantation process to form such source and drain regions. Furthermore, a channel region may be formed subjacent to the dual-metal gate electrode 318. Electrical contacts may be formed to the source region, the drain region, and the dual-metal gate electrode 318 to enable the CMOS transistor that is formed.

Accordingly, implementations of the invention have been described that enable a dual-metal gate electrode to be fabricated with a lower aspect ratio and a wider trench opening than conventional dual-metal gate fabrication processes. The result is less trench overhang and less void formation, resulting in metal gate electrodes with lower resistance and higher reliability. It should be noted that although a few examples of materials are described here that may be used to form the first and second workfunction metal layers, as well as the fill metal layer, those metal layers may be made from many other materials, as will be apparent to those skilled in the art.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
   providing a substrate having a pair of spacers separated by a trench;
   conformally depositing a high-k dielectric layer into the trench between the spacers;
   conformally depositing a first workfunction metal layer into the trench atop the high-k dielectric layer;
   depositing a sacrificial masking material into the trench atop the first workfunction metal layer;
   etching a portion of the sacrificial masking material to expose a portion of the first workfunction metal layer;
   etching the exposed portion of the first workfunction metal layer to form a recessed workfunction metal layer;
   etching the remaining sacrificial masking material;
   conformally depositing a second workfunction metal layer atop the recessed workfunction metal layer; and
   depositing an electrode metal layer atop the second workfunction metal layer.

2. The method of claim 1, further comprising planarizing at least the electrode metal layer.

3. The method of claim 1, wherein a CVD process is used to conformally deposit the high-k dielectric layer, the first workfunction metal layer, and the second workfunction metal layer.

4. The method of claim 3, wherein the CVD process comprises an ALD process.

5. The method of claim 1, wherein the first workfunction metal layer and the second workfunction metal layer each comprise at least one of ruthenium, palladium, platinum, cobalt, nickel, conductive metal oxides, ruthenium oxide, hafnium, zirconium, titanium, tantalum, aluminum, hafnium carbide, zirconium carbide, titanium carbide, tantalum carbide, and aluminum carbide, as well as alloys and metal carbides that include at least one of the above metals.

6. The method of claim 1, wherein a spin-on deposition process is used to deposit the sacrificial masking material.

7. The method of claim 6, wherein the sacrificial masking material comprises a SOG material, a SLAM material, or a BARC material.

8. The method of claim 1, wherein the etching of the sacrificial masking material comprises applying a wet etch chemistry to the sacrificial masking material.

9. The method of claim 8, wherein the wet etch chemistry comprises a fluorine-based wet etch chemistry.

10. The method of claim 1, wherein the etching of the sacrificial masking material comprises applying a dry etch chemistry to the sacrificial masking material.

11. The method of claim 10, wherein the dry etch chemistry comprises a $CH_2F_2$ dry etch chemistry, a $SF_6$ dry etch chemistry, or a $NF_3$ dry etch chemistry.

12. The method of claim 1, wherein the etching of a portion of the sacrificial masking material comprises etching the sacrificial masking material until it is approximately one-half to three-quarters of the trench height.

13. The method of claim 1, wherein the etching of the first workfunction metal layer comprises applying a wet etch chemistry to the first workfunction metal layer.

14. The method of claim 13, wherein the wet etch chemistry comprises at least one of the following combinations: a combination of distilled water, $NH_4OH$, and $H_2O_2$, a combination of sulfuric acid, peroxide, and distilled water, a combination of phosphoric acid, acetic acid, and nitric acid, a combination of hydrochloric acid, $H_2O_2$, and water, or a combination of hydrochloric acid, nitric acid, and water.

15. The method of claim 1, wherein the etching of the first workfunction metal layer comprises applying a dry etch chemistry to the first workfunction metal layer.

16. The method of claim 1, wherein the electrode metal layer comprises tungsten, aluminum, copper, or a low resistivity metal.

17. A method comprising:
   providing a substrate;
   forming a high-k dielectric layer on the substrate;
   etching the high-k dielectric layer to form a high-k gate dielectric layer;
   forming a pair of spacers on opposing edges of the high-k gate dielectric layer;
   conformally depositing a first workfunction metal layer into a trench between the spacers and atop the high-k gate dielectric layer;
   depositing a sacrificial masking material into the trench atop the first workfunction metal layer;
   etching a portion of the sacrificial masking material to expose a portion of the first workfunction metal layer;
   etching the exposed portion of the first workfunction metal layer to form a recessed workfunction metal layer;
   etching the remaining sacrificial masking material;
   conformally depositing a second workfunction metal layer atop the recessed workfunction metal layer; and
   depositing an electrode metal layer atop the second workfunction metal layer.

18. The method of claim 17, further comprising planarizing at least the electrode metal layer.

19. The method of claim 17, wherein the first workfunction metal layer and the second workfunction metal layer each comprise at least one of ruthenium, palladium, platinum, cobalt, nickel, conductive metal oxides, ruthenium oxide, hafnium, zirconium, titanium, tantalum, aluminum, hafnium carbide, zirconium carbide, titanium carbide, tantalum carbide, and aluminum carbide, as well as alloys and metal carbides that include at least one of the above metals.

20. The method of claim 17, wherein a spin-on deposition process is used to deposit the sacrificial masking material.

21. The method of claim 17, wherein the etching of the sacrificial masking material comprises applying a fluorine-based wet etch chemistry.

22. The method of claim 17, wherein the etching of the sacrificial masking material comprises applying a $CH_2F_2$ dry etch chemistry, a $SF_6$ dry etch chemistry, or a $NF_3$ dry etch chemistry.

23. The method of claim 17, wherein the etching of the first workfunction metal layer comprises applying at least one of the following combinations: a combination of distilled water, $NH_4OH$, and $H_2O_2$, a combination of sulfuric acid, peroxide, and distilled water, a combination of phosphoric acid, acetic acid, and nitric acid, a combination of hydrochloric acid, $H_2O_2$, and water, or a combination of hydrochloric acid, nitric acid, and water.

24. The method of claim 17, wherein the etching of the first workfunction metal layer comprises applying a dry etch chemistry to the first workfunction metal layer.

* * * * *